(12) United States Patent
Matsunami et al.

(10) Patent No.: US 9,076,723 B1
(45) Date of Patent: Jul. 7, 2015

(54) NON-VOLATILE MEMORY DEVICE AND METHOD FOR MANUFACTURING SAME

(71) Applicant: Kabushiki Kaisha Toshiba, Minato-ku (JP)

(72) Inventors: Junya Matsunami, Yokkaichi (JP); Masayuki Ichige, Yokkaichi (JP); Takuya Konno, Yokkaichi (JP); Kikuko Sugimae, Kuwana (JP)

(73) Assignee: Kabushiki Kaisha Toshiba, Minato-ku (JP)

( * ) Notice: Subject to any disclaimer, the term of this patent is extended or adjusted under 35 U.S.C. 154(b) by 0 days.

(21) Appl. No.: 14/299,561

(22) Filed: Jun. 9, 2014

Related U.S. Application Data

(60) Provisional application No. 61/950,419, filed on Mar. 10, 2014.

(51) Int. Cl.
*H01L 27/24* (2006.01)
*H01L 45/00* (2006.01)
*G11C 13/00* (2006.01)

(52) U.S. Cl.
CPC .......... *H01L 27/249* (2013.01); *H01L 27/2481* (2013.01); *H01L 45/085* (2013.01); *G11C 13/0011* (2013.01)

(58) Field of Classification Search
CPC ... H01L 27/2481; H01L 27/249; H01L 45/08; H01L 45/085; G11C 13/0009; G11C 13/0011; G11C 2213/71
See application file for complete search history.

(56) References Cited

U.S. PATENT DOCUMENTS

| | | | |
|---|---|---|---|
| 8,242,478 B2 | 8/2012 | Sakamoto | |
| 8,299,571 B2* | 10/2012 | Ozawa et al. | 257/530 |
| 8,426,306 B1 | 4/2013 | Gee et al. | |
| 8,664,632 B2* | 3/2014 | Matsushita et al. | 257/4 |
| 8,772,753 B2* | 7/2014 | Baba | 257/4 |
| 2012/0147644 A1 | 6/2012 | Scheuerlein | |
| 2013/0009122 A1 | 1/2013 | Park et al. | |
| 2013/0016555 A1 | 1/2013 | Kim et al. | |
| 2013/0075686 A1 | 3/2013 | Kawasaki | |
| 2013/0082231 A1 | 4/2013 | Tada et al. | |
| 2013/0182487 A1* | 7/2013 | Lee et al. | 365/148 |
| 2013/0248796 A1* | 9/2013 | Inokuma | 257/1 |
| 2014/0131653 A1* | 5/2014 | Lee et al. | 257/4 |
| 2014/0264225 A1* | 9/2014 | Arayashiki | 257/2 |
| 2014/0319442 A1* | 10/2014 | Hayashi | 257/2 |
| 2015/0016177 A1* | 1/2015 | Matsunami | 365/148 |

* cited by examiner

*Primary Examiner* — Allison P Bernstein
(74) *Attorney, Agent, or Firm* — Oblon, McClelland, Maier & Neustadt, L.L.P.

(57) ABSTRACT

A nonvolatile memory device includes: a first interconnection extending in a first direction; a second interconnection extending in a second direction, and a lower end of the second interconnection being located above the first interconnection; a plurality of third interconnections extending in a third direction, and the third interconnections being arranged in the second direction; a current limitation layer provided between the second interconnection and the third interconnections; a metal ion source layer provided between the current limitation layer and the third interconnections; a resistance change layer provided between the current limitation layer and the third interconnections; and a selector provided between the first interconnection and the lower end of the second interconnection.

17 Claims, 15 Drawing Sheets

NON-VOLATILE MEMORY DEVICE AND METHOD FOR MANUFACTURING SAME

CROSS-REFERENCE TO RELATED APPLICATIONS

This application is based upon and claims the benefit of priority from U.S. Provisional Patent Application 61/950,419, filed on Mar. 10, 2014; the entire contents of which are incorporated herein by reference.

FIELD

Embodiments described herein relate generally to a nonvolatile memory device and a manufacturing same.

BACKGROUND

With the increasing integration degree of semiconductor devices, circuit patterns of LSI elements are becoming finer. To make the pattern finer, it is required not only to reduce the line width but also to improve the dimensional accuracy and positional accuracy of the pattern. Also for memory devices, it is required to retain a certain amount of charge necessary for memory in a smaller region in a minute cell.

As a technology to overcome such a problem, there is a nonvolatile memory device in which a memory cell is formed using a resistance change layer. The nonvolatile memory device has a three-dimensionally stacked structure, and can therefore increase the integration degree as compared to memory cells utilizing a two-dimensional plane. As the integration degree is increased, such a nonvolatile memory device is required to have higher reliability.

DETAILED DESCRIPTION

Figure 1A:
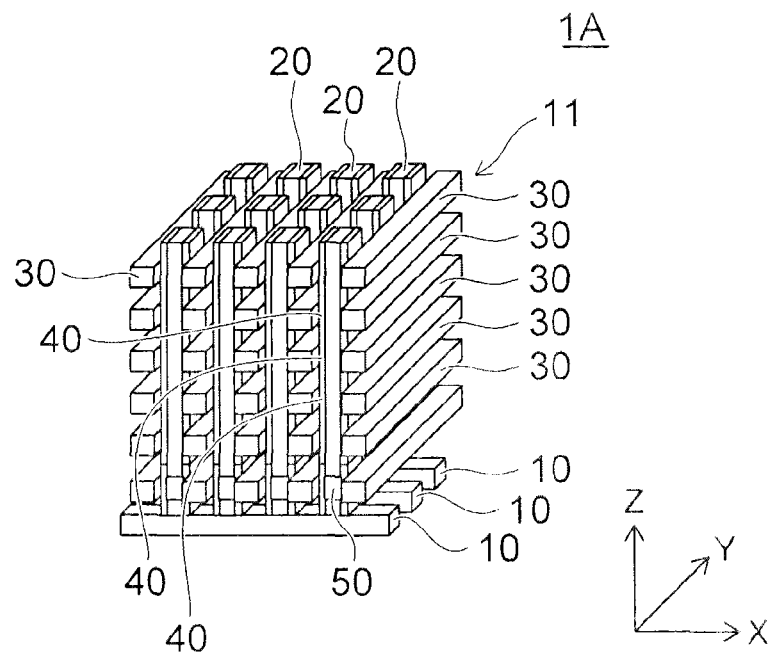
FIG. 1A is a schematic stereo view showing a nonvolatile memory device according to a first embodiment.

According to one embodiment, a nonvolatile memory device includes: a first interconnection extending in a first direction; a second interconnection extending in a second direction crossing the first direction, and a lower end of the second interconnection being located above the first interconnection; a plurality of third interconnections extending in a third direction, the third direction crossing the first direction and the second direction, and the third interconnections being arranged in the second direction; a current limitation layer provided between the second interconnection and the third interconnections; a metal on source layer provided between the current limitation layer and the third interconnections; a resistance change layer provided between the current limitation layer and the third interconnections; and a selector provided between the first interconnection and the lower end of the second interconnection.

Hereinbelow, embodiments are described with reference to the drawings. In the following description, identical components are marked with the same reference numerals, and a description of components once described is omitted as appropriate.

First Embodiment

First, an overview of a memory cell array 11 with a three-dimensional structure included in a nonvolatile memory device 1A is described.

Figure 1B:
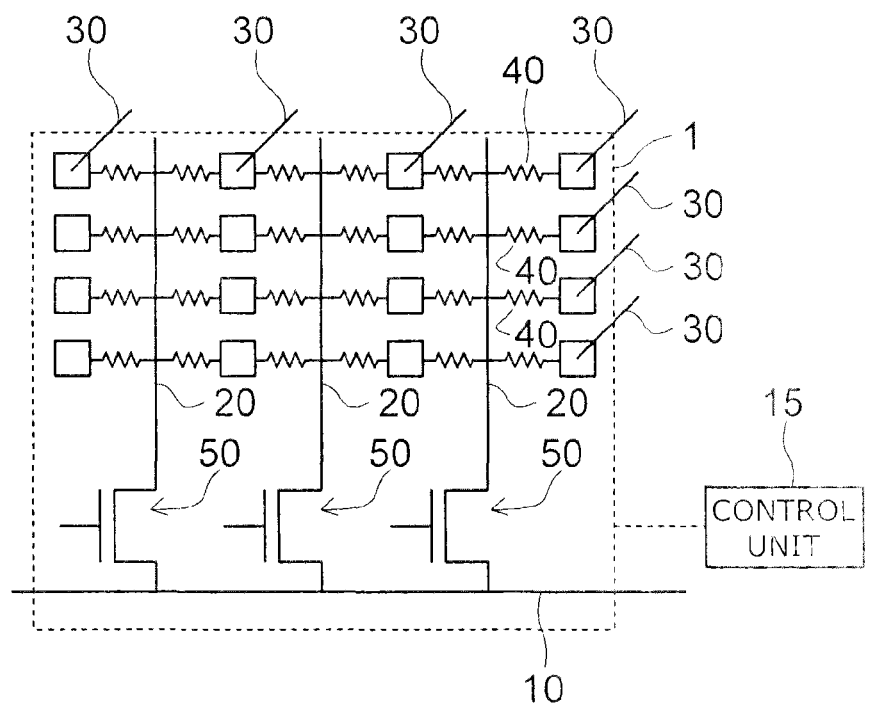
FIG. 1B is an equivalent circuit diagram showing the nonvolatile memory device according to the first embodiment.

FIG. 1A is a schematic stereo view showing a nonvolatile memory device according to a first embodiment, and FIG. 1B is an equivalent circuit diagram showing the nonvolatile memory device according to the first embodiment.

The nonvolatile memory device 1A includes the memory cell array 11 having a three-dimensional structure. The memory cell array 11 includes a global bit line 10 (a first interconnection), a local bit line 20 (a second interconnection), a word line 30 (a third interconnection), a memory element 40, and a selector 50.

A plurality of memory elements 40 are arranged three-dimensionally in the memory cell array 11.

A plurality of global bit lines 10 extend in the X-direction (a first direction), and are arranged in the Y-direction (a third direction). A plurality of local bit lines 20 extend in the Z-direction (a second direction), and are arranged in the Y-direction. A plurality of word lines 30 extend in the Y-direction, and are arranged in the Z-direction.

The nonvolatile memory device 1A is a cross-point type nonvolatile memory device. In other words, the memory element 40 is provided in a position where each of the plurality of local bit lines 20 and each of the plurality of word lines 30 cross each other. The memory element 40 changes its resistance in accordance with the applied voltage (described later).

The selector 50 is provided between the local bit line 20 and the global bit line 10. The selector 50 is a thin film transistor having a gate electrode, for example. Each of the global bit line 10, the local bit line 20, and the word line 30 contains at least one of tungsten (W), aluminum (Al), copper (Cu), titanium (Ti), polysilicon, graphene, carbon nanotubes, etc.

The nonvolatile memory device 1A includes a control circuit unit 15. The control circuit unit 15 is disposed in a peripheral circuit region (not shown) around the memory cell array 11. A voltage is applied by the control circuit unit 15 to each of the global bit line 10, the word line 30, and the gate electrode of the selector 50.

The control circuit unit 15 supplies a prescribed electric potential to the global bit line 10 and the word line 30. The control circuit unit 15 can switch a specific selector 50 to the ON state to supply an electric potential to the local bit line 20 connected to the selector 50. Thereby, a voltage is applied across the memory element 40 provided between the selected local bit line 20 and the word line 30 crossing this.

The control circuit unit 15 can make setting such that electric potential is higher at the word line 30 than at the local bit line 20 and electric potential is lower at the word line 30 than at the local bit line 20. Thereby, data can be stored in or erased from the memory element 40.

Here, an operation in which a selected bit that is a selected memory cell is rewritten from the high resistance state to the low resistance state may be referred to as a set operation, and an operation in which it is rewritten from the low resistance state to the high resistance state may be referred to as a reset operation.

The cross-sectional structure of the nonvolatile memory device 1A will now be described in detail.

Figure 2:
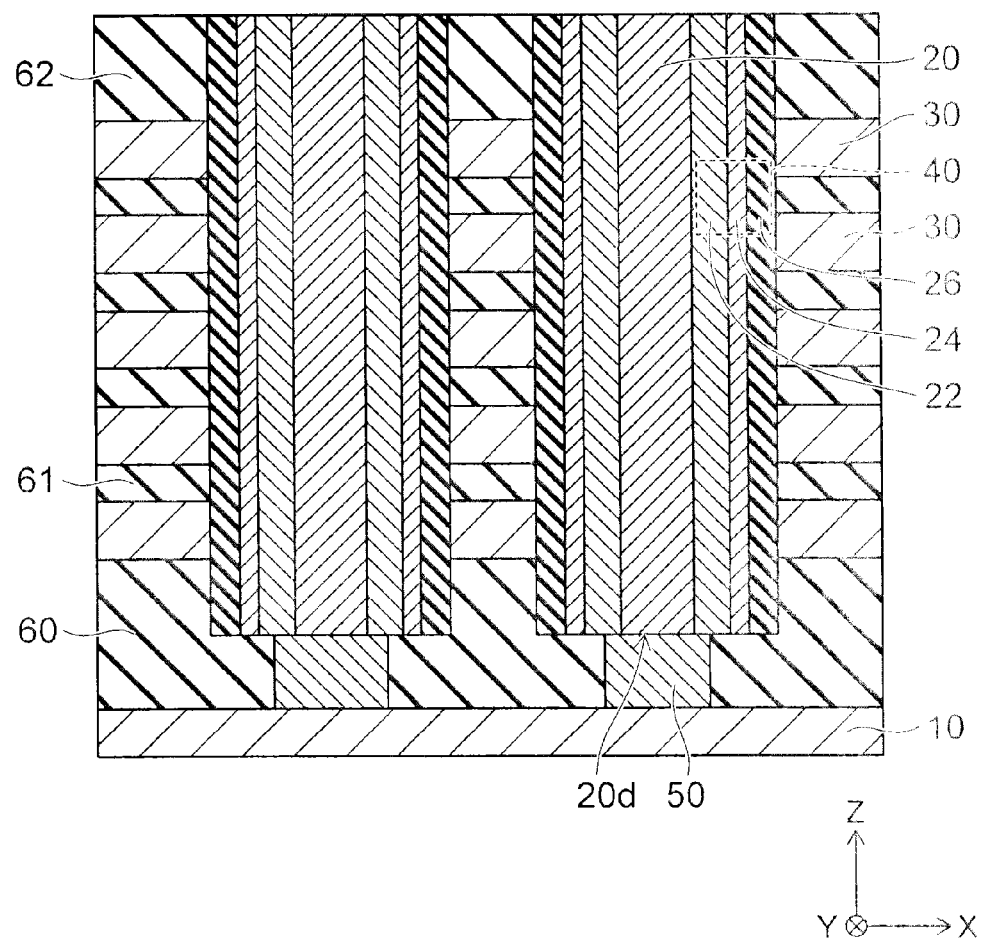
FIG. 2 is a schematic cross-sectional view showing the nonvolatile memory device according to the first embodiment.

FIG. 2 is a schematic cross-sectional view showing the nonvolatile memory device according to the first embodiment.

FIG. 2 shows a cross section of the nonvolatile memory device 1A (the memory cell array 11) taken along the X-Z plane of FIG. 1A.

Although in FIG. 2 five word lines 30 are illustrated, in the Z-direction, this is an example and the number of word lines 30 is not limited thereto.

In the nonvolatile memory device 1A, the local bit line 20 extends in the Z-direction crossing the X-direction. The lower end 20d of the local bit line 20 is located above the global bit line 10. The plurality of word lines 30 extend in the Y-direction crossing the X-direction and the Z-direction, and are arranged in the Z-direction.

A current limitation layer 22 is provided between the local bit line 20 and the plurality of word lines 30. The current limitation layer 22 extends in the Z-direction, and is in contact with the local bit line 20. The current limitation layer 22 is a high resistive layer with electrical conductivity. The current limitation layer 22 contains at least one element of Mo, W, Ta, Ti, Si, Ge, C, Ga, As, N, P, and the like, for example. The resistivity of the current limitation layer 22 is 1 Ω·cm to $10^8$ Ω·cm, and can be set to a desired value by adjusting the element composition ratio, for example.

A metal ion source layer 24 is provided between the current limitation layer 22 and the plurality of word lines 30. In the first embodiment, the metal ion source layer 24 extends in the Z-direction. The metal ion source layer 24 is provided between a position between word lines 30 adjacent in the Z-direction and the current limitation layer 22. The metal ion source layer 24 is provided between the current limitation layer 22 and a resistance change layer 26. The metal on source layer 24 contains at least one element of Au, Ag, Pd, Ir, Pt, W, Hf, Zr, Ti, Ni, Co, Al, Cr, Cu, and the like, for example.

The resistance change layer 26 is provided between the metal ion source layer 24 and the plurality of word lines 30. In the resistance change layer 26, the resistance value can be changed by metal ions released from the metal ion source layer 24 being diffused into the resistance change layer 26.

An example of the resistance change layer 26 is a silicon-containing layer. For example, the resistance change layer 26 contains silicon oxide ($SiO_x$), polysilicon, or the like. The resistance change layer 26 may be a stacked body of a silicon oxide film and a polysilicon film. Such a silicon-containing layer is used as the matrix of the resistance change layer 26. The resistance change layer is not limited to a silicon-containing layer. Also GeSbTe, $HfO_x$, $AlO_x$, and the like may be used. The resistance of the resistance change layer 26 can be changed by diffusing metal ions released from the metal ion source layer 24 into the matrix, or returning the diffused metal ions to the metal ion source layer 24 (described later).

The memory element 40 is the portion surrounded by the broken line in FIG. 2. The memory element 40 is provided between the local bit line 20 and the word line 30. The memory element 40 includes the current limitation layer 22, the metal ion source layer 24, and the resistance change layer 26, for example.

The selector 50 is provided between the global bit line 10 and the lower end 20d of the local bit line 20.

An interlayer insulating film 60 is provided between the global bit line 10 and the word line 30. An interlayer insulating film 61 is provided between word lines 30 adjacent in the Z-direction. An interlayer insulating film 62 is provided on the uppermost word line 30.

Operations of the memory element 40 will now be described.

Figure 3A:
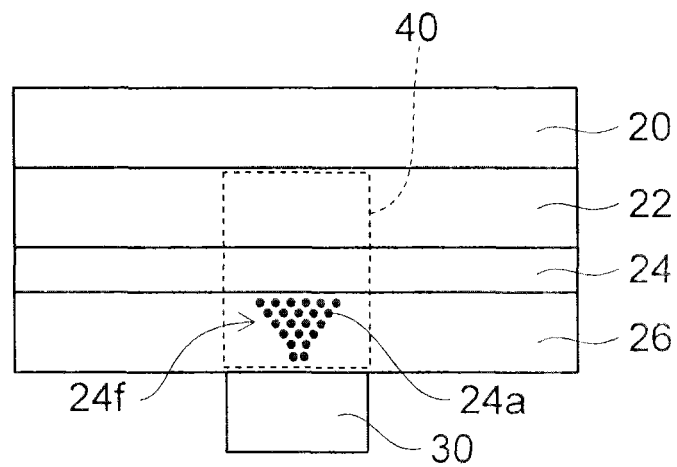
FIG. 3A and FIG. 3B are schematic views describing operations of the memory element according to the first embodiment.
Figure 3B:
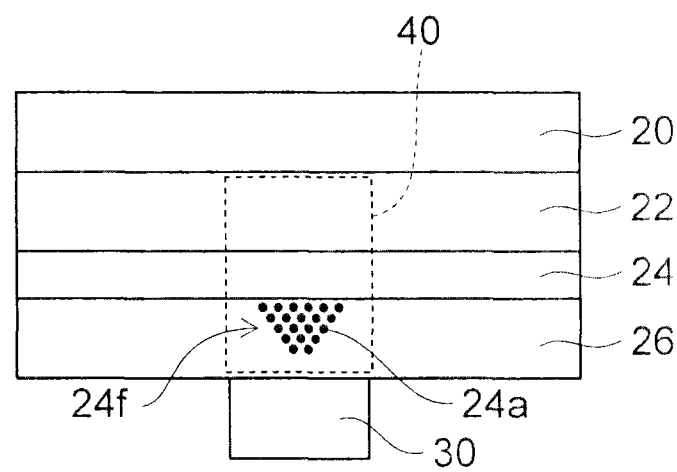

FIG. 3A and FIG. 3B are schematic views describing operations of the memory element according to the first embodiment.

FIG. 3A and FIG. 3B show an example of the operation of the memory element. Here, the metal ion source layer 24 can use Ag, Cu, Ni, and the like; in the following description, the metal ion source layer 24 contains Ag as an example.

First, as shown in FIG. 3A, a prescribed voltage is applied between the word line 30 and the local bit line 20. Herein, a high electric potential is applied to the local bit line 20 with respect to the word line 30. Thereby, metal ions (for example, Ag ions) 24a are released from the metal ion source layer 24 to the resistance change layer 26 side, and a filament 24f containing Ag ions 24a is formed.

When the lower end of the filament 24f has come close to the word line 30 by continuing to apply a voltage, the resistance of the memory element 40 transitions from the high resistance state "0" to the low resistance state "1", and the writing of data is performed on the memory element 40. This operation is referred to as the set operation. The voltage when the set operation is performed is referred to as a set voltage, and the current flowing through the memory element 40 during set voltage application is referred to as a set current. The state of the memory element 40 after the set operation may be referred to as a set state.

In the set operation, the current flowing between the word line 30 and the local bit line 20 is appropriately suppressed by the interposition of the current limitation layer 22, and the thickness of the filament 24f is suppressed so as not to become too thick.

Next, in FIG. 3B, a low electric potential is applied to the local bit line 20 with respect to the word line 30. Thereby, metal ions 24a return from the resistance change layer 26 to the metal ion source layer 24 side, and the lower end of the filament 24f moves away from the word line 30. In other words, the filament 24f and the word line 30 become non-contact. Thereby, the resistance of the memory element 40 transitions from the low resistance state "1" to the high resistance state "0", and the data written in the memory element 40 are erased.

As described above, this operation is referred to as the reset operation. The state of the memory element 40 after the reset operation may be referred to as a reset state.

FIG. 4A to FIG. 9B are schematic views showing the manufacturing process of the nonvolatile memory device according to the first embodiment. The drawings of the numbers including "A" show schematic cross-sectional views, and the drawings of the numbers including "B" show schematic plan views.

Figure 4A:
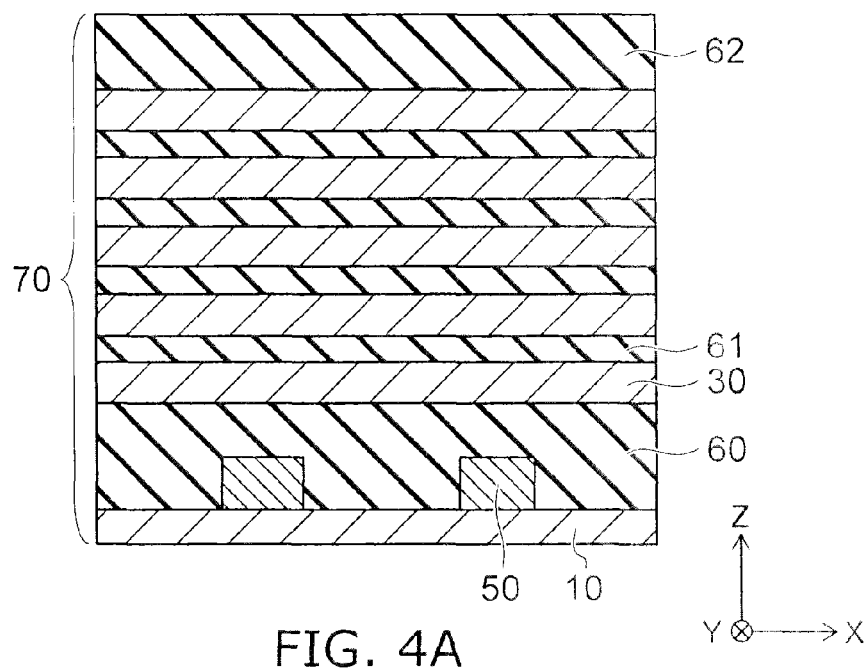
FIG. 4A to FIG. 9B are schematic views showing the manufacturing process of the nonvolatile memory device according to the first embodiment.
Figure 4B:
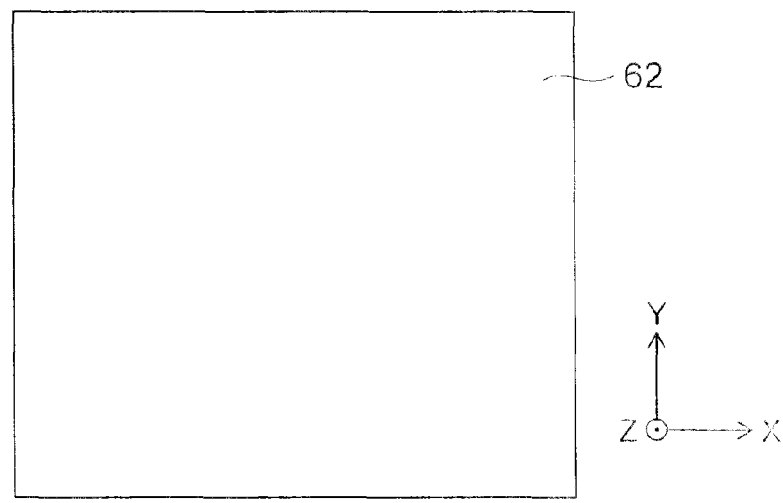

First, as shown in FIG. 4A and FIG. 4B, a first stacked body 70 is formed on the global bit line 10 via the selector 50. In the first stacked body 70, the word line 30 and the interlayer insulating film 61 are alternately stacked in the Z-direction. The first stacked body 70 includes the interlayer insulating films 60 and 62.

In this stage, the global bit lines 10 extend in the X-direction and are arranged in the Y-direction as shown in FIG. 1A. The word line 30 is in a state before being processed into a line configuration, and is a conductive layer spreading in the X-Y plane.

Figure 5A:
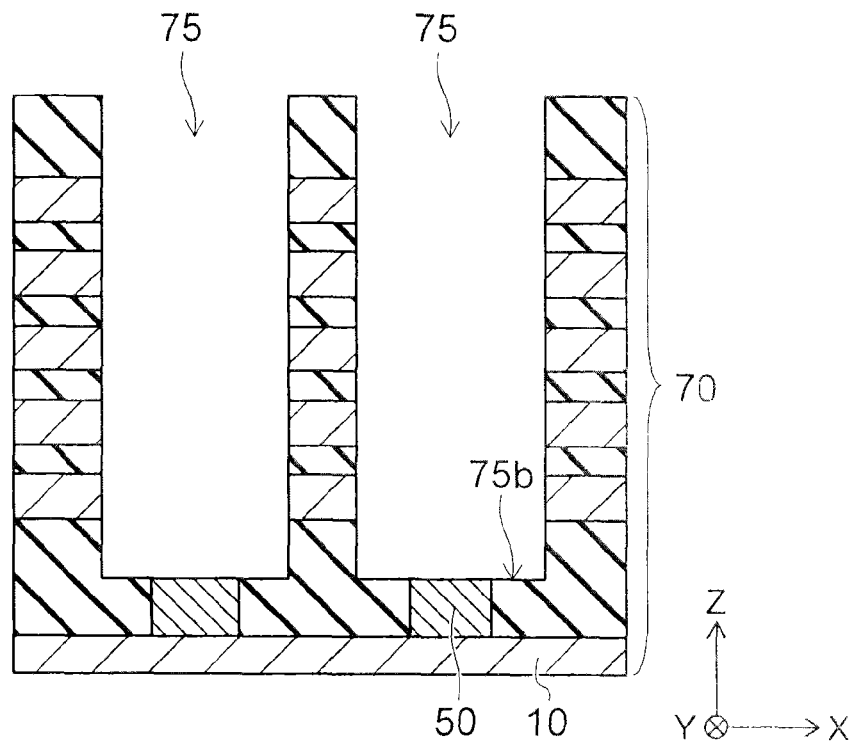
Figure 5B:
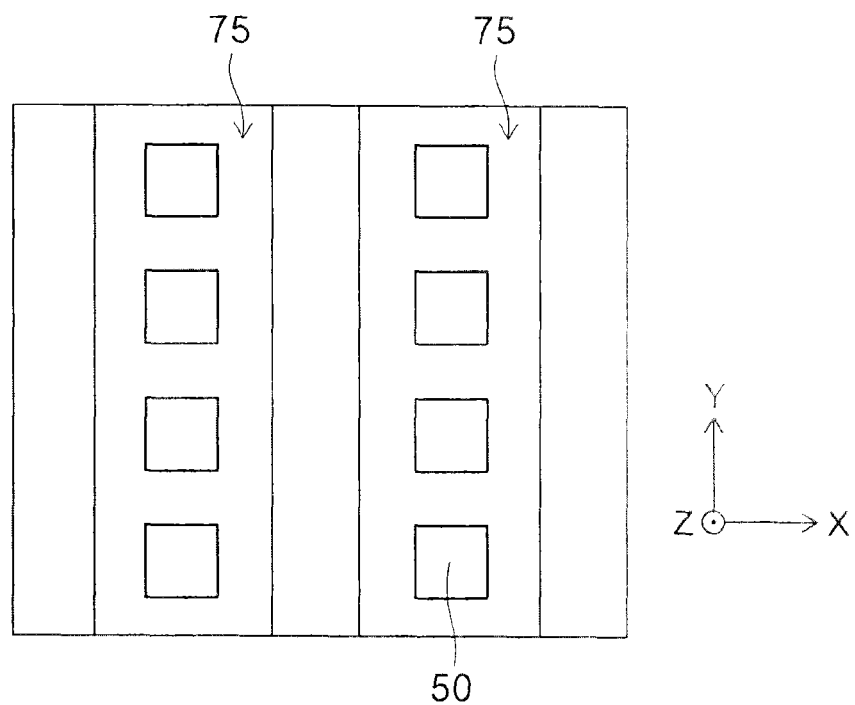

Next, as shown in FIG. 5A and FIG. 5B, trenches 75 are formed in the first stacked body 70 by RIE (reactive ion etching). The trench 75 is dug in the Z-direction, and extends in the Y-direction.

By forming the trench 75, the selector 50 is exposed at the bottom 75b of the trench 75. By the first stacked body 70 being separated in the X-direction by the trench 75, a plurality of word lines 30 extending in the Y-direction and arranged in the Z-direction are formed.

Figure 6A:
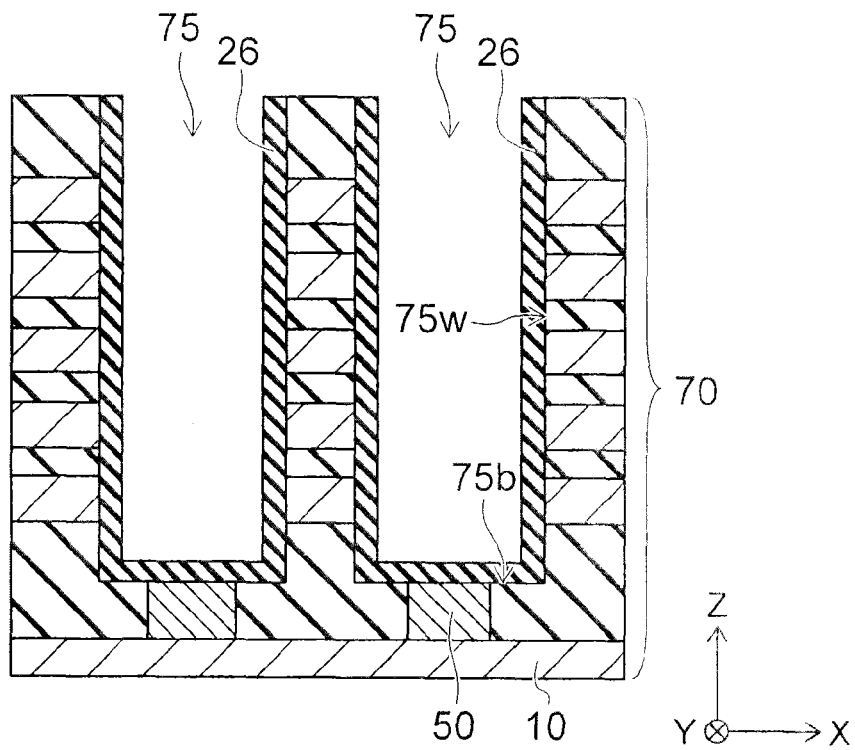
Figure 6B:
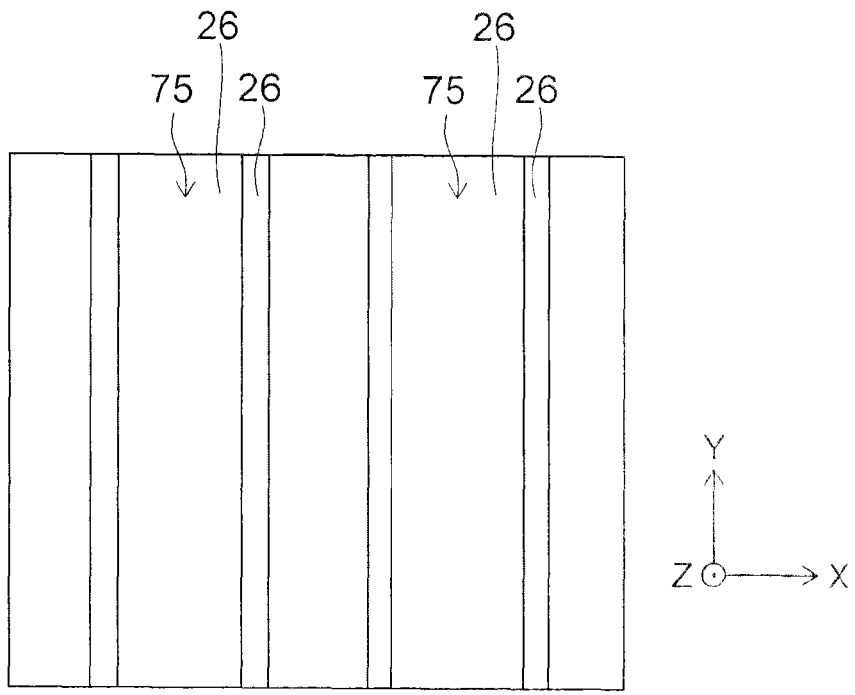

Next, as shown in FIG. 6A and FIG. 6B, the resistance change layer 26 is formed on the inner side surface 75w and the bottom 75b of the trench 75 by CVD (chemical vapor deposition), ALD (atomic layer deposition), plating, or the like.

Figure 7A:
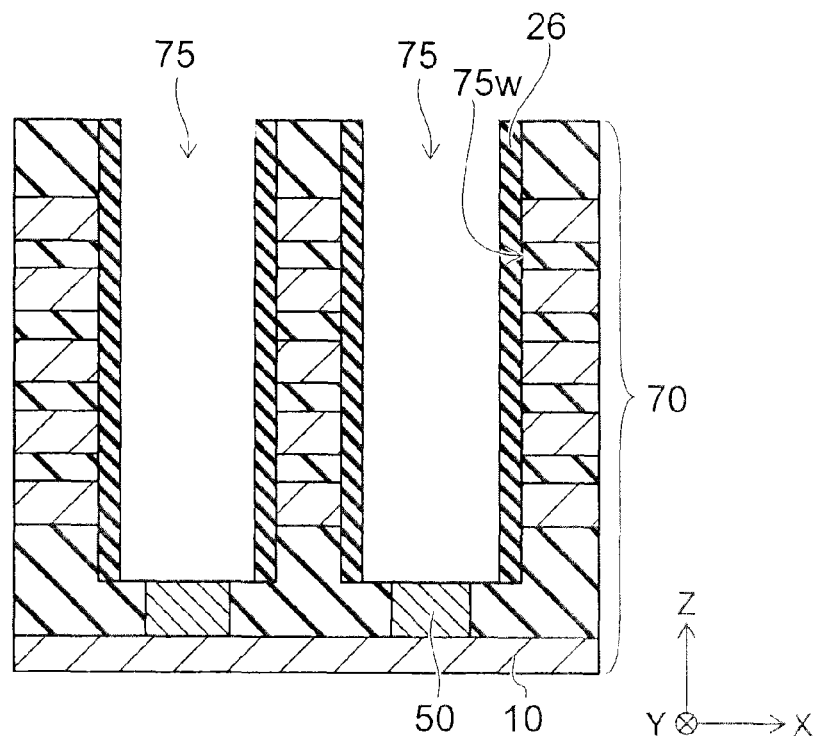
Figure 7B:
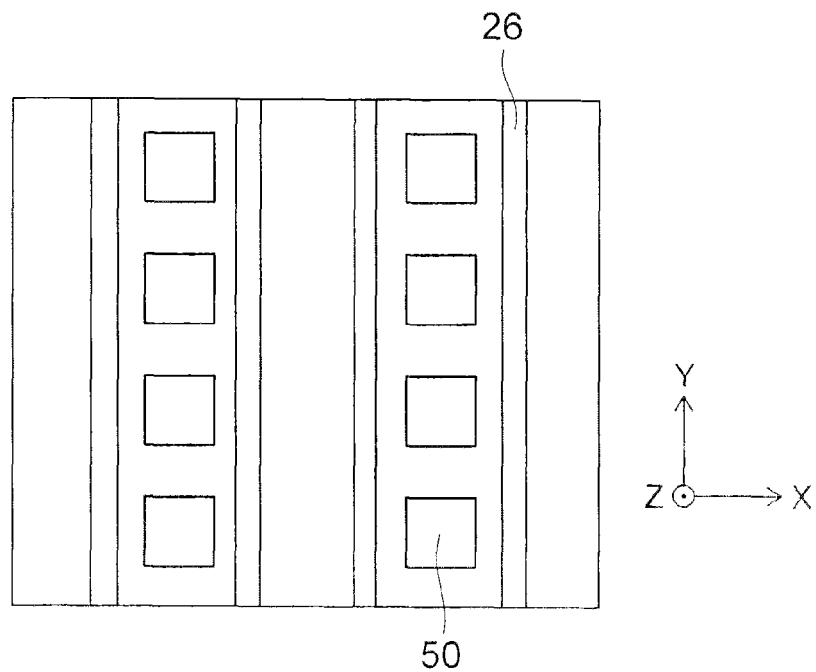

Next, as shown in FIG. 7A and FIG. 7B, the resistance change layer 26 deposited on the bottom 75b of the trench 75 is removed by RIE. Thereby, the selector 50 is exposed again. Since the resistance value of the resistance change layer 26 is high, removing the resistance change layer 26 from the bottom 75b of the trench 75 improves the electrical contact between the selector 50 and the local bit line 20.

The process of removing a deposited coating from the bottom 75b of the trench 75 is referred to as bottom etching in the embodiment.

Figure 8A:
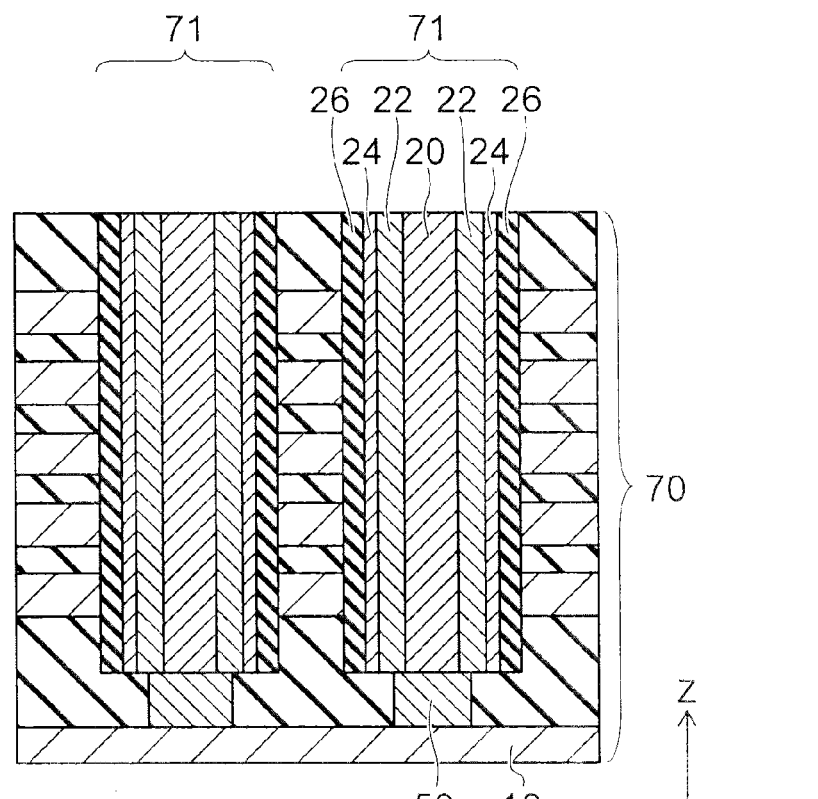
Figure 8B:
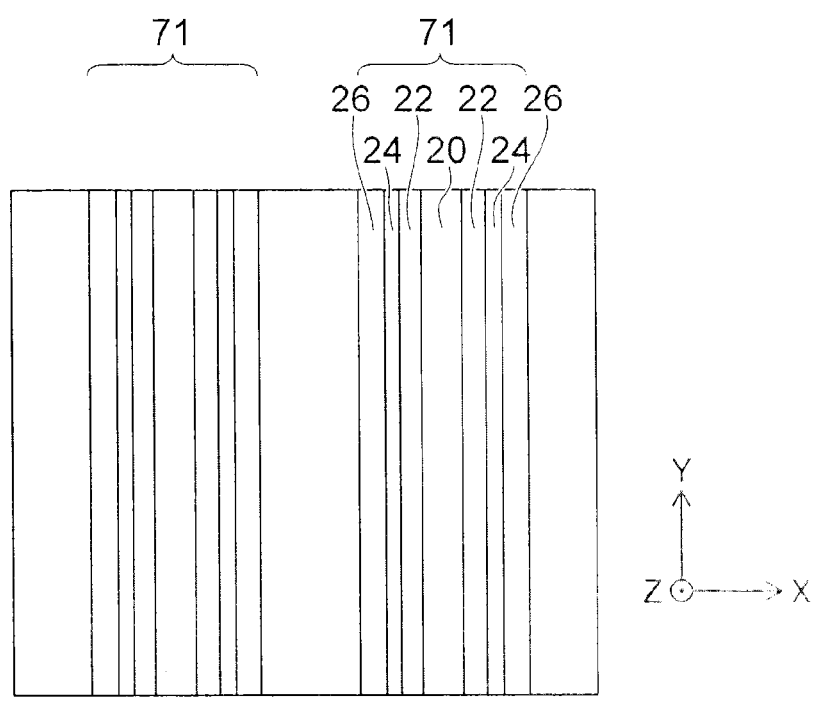

Subsequently, the metal ion source layer 24 is deposited on the resistance change layer 26 and on the bottom 75b of the trench 75 by CVD, ALD, plating, or the like, and the bottom etching of the metal ion source layer 24 is performed. Subsequently, the current limitation layer 22 is deposited on the metal ion source layer 24 and on the bottom 75b of the trench 75 by CVD, ALD, plating, or the like, and the bottom etching of the current limitation layer 22 is performed. Subsequently, the local bit line 20 is deposited on the current limitation layer 22 and on the bottom 75b of the trench 75 by CVD, ALD, plating, or the like. As necessary, CMP (chemical mechanical polishing) is performed on the upper surface of the stacked body in which these coatings are stacked, and the upper surface is planarized. This state is shown in FIG. 8A and FIG. 8B.

Thereby, a second stacked body 71 is formed in the trench 75. In the second stacked body 71, the local bit line 20, the current limitation layer 22, the metal ion source layer 24, and the resistance change layer 26 are stacked in the X-direction.

Here, the local bit line 20 is in contact with the selector 50, and extends in the Y-direction. In this stage, the local bit line 20 is in a state before being processed into a line configuration, and is a layer spreading in the Y-Z plane. The current limitation layer 22 is provided between the local bit line 20 and the plurality of word lines 30, and is in contact with the local bit line 20.

The metal ion source layer 24 is provided between the current limitation layer 22 and the plurality of word lines 30. The resistance change layer 26 is provided between the metal ion source layer 24 and the plurality of word lines 30.

Figure 9A:
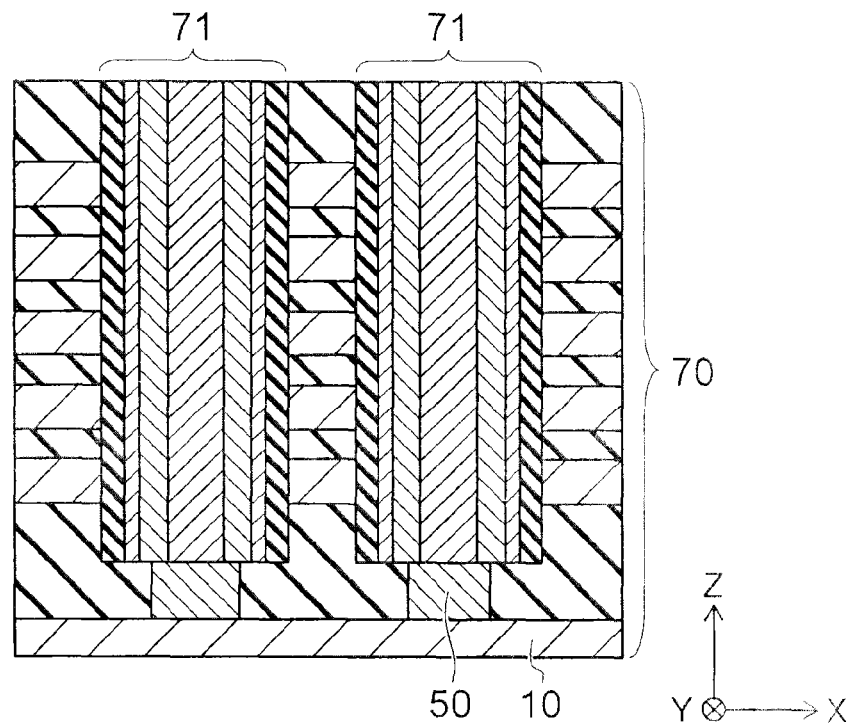
Figure 9B:
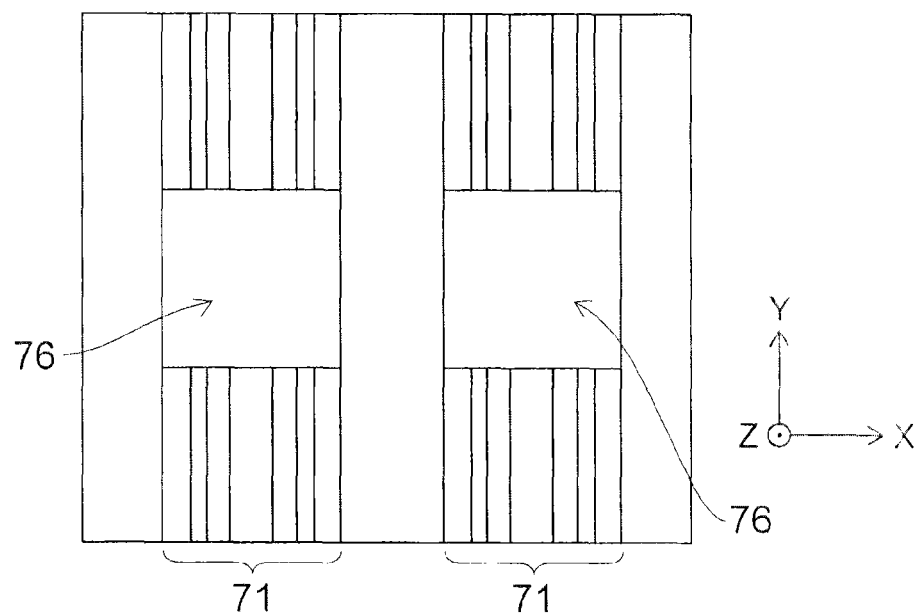

Next, as shown in FIG. 9A and FIG. 9B, trenches 76 are formed in the second stacked body 71 to separate the second stacked body 71 in the Y-direction. By such a manufacturing process, the nonvolatile memory device 1A shown in FIG. 1A is formed.

In the nonvolatile memory device 1A, since the resistance change layer 26 is provided between the metal on source layer 24 and the plurality of word lines 30, the plurality of word lines 30 arranged in the Z-direction do not electrically short-circuit.

In a structure in which the metal ion source layer 24 extending in the Z-direction is provided between the resistance change layer 26 and the plurality of word lines 30, the plurality of word lines 30 arranged in the Z-direction will short-circuit with one another via the metal ion source layer 24, for example. Consequently, this structure will not function as a nonvolatile memory device.

In the nonvolatile memory device 1A, the current limitation layer 22 is interposed between the local bit line 20 and the metal ion source layer 24. The current limitation layer 22 serves as what is called a barrier layer to prevent mutual diffusion of metal between the local bit line 20 and the metal ion source layer 24.

Thus, the first embodiment provides the nonvolatile memory device 1A with high reliability.

Second Embodiment

Figure 10:
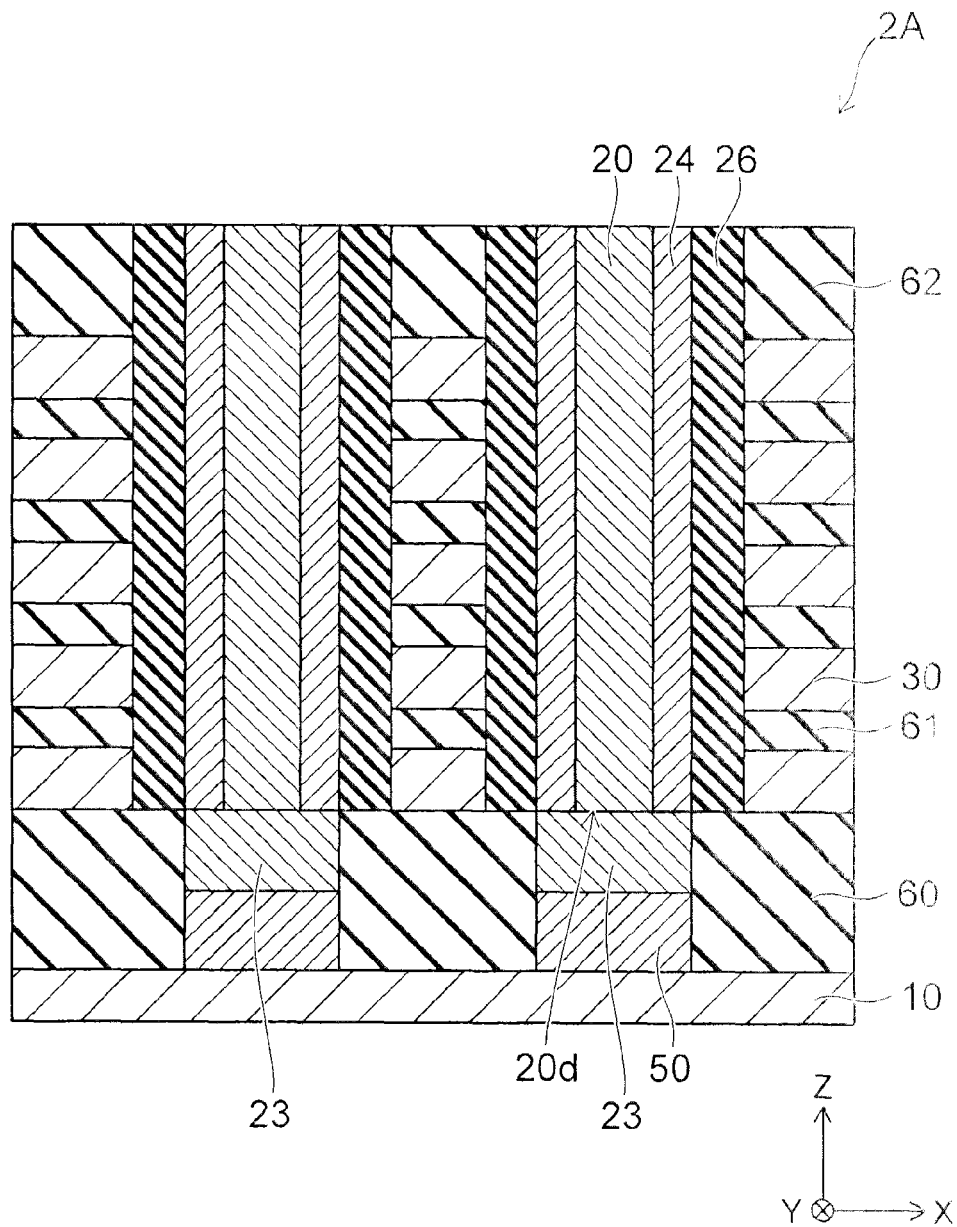
FIG. 10 is a schematic cross-sectional view showing a nonvolatile memory device according to a second embodiment.

FIG. 10 is a schematic cross-sectional view showing a nonvolatile memory device according to a second embodiment.

In a nonvolatile memory device 2A according to the second embodiment, the global bit line 10 extends in the X-direction. The local bit line 20 extends in the Z-direction, and its lower end 20d is located above the global bit line 10. The plurality of word lines 30 extend in the Y-direction, and are arranged in the Z-direction. The selector 50 is provided between the global bit line 10 and the lower end 20d of the local bit line 20.

The metal ion source layer 24 is in contact with the local bit line 20, and is provided between the local bit line 20 and the plurality of word lines 30. The resistance change layer 26 is provided between the metal ion source layer 24 and the plurality of word lines 30.

In the nonvolatile memory device 2A, a current limitation layer 23 is provided between the selector 50 and the lower end 20d of the local bit line 20. The composition of the current limitation layer 23 is the same as the composition of the current limitation layer 22, for example. The current limitation layer 23 is formed on the selector 50 before the plurality of word lines 30 and the interlayer insulating films 60 to 62 are formed on the selector 50.

In the nonvolatile memory device 2A, the current limitation layer 23 is provided between the selector 50 and the local bit line 20. Thereby, during the set operation, an excessive current does not flow between the word line 30 and the local bit line 20.

In the second embodiment, the current limitation layer 23 is disposed under the local bit line 20. Thereby, the current limitation layer 22 in the second stacked body 71 can be omitted, and therefore the thickness of the second stacked body 71 is reduced to enable the scaledown of the nonvolatile memory device in the X-direction.

Third Embodiment

Figure 11:
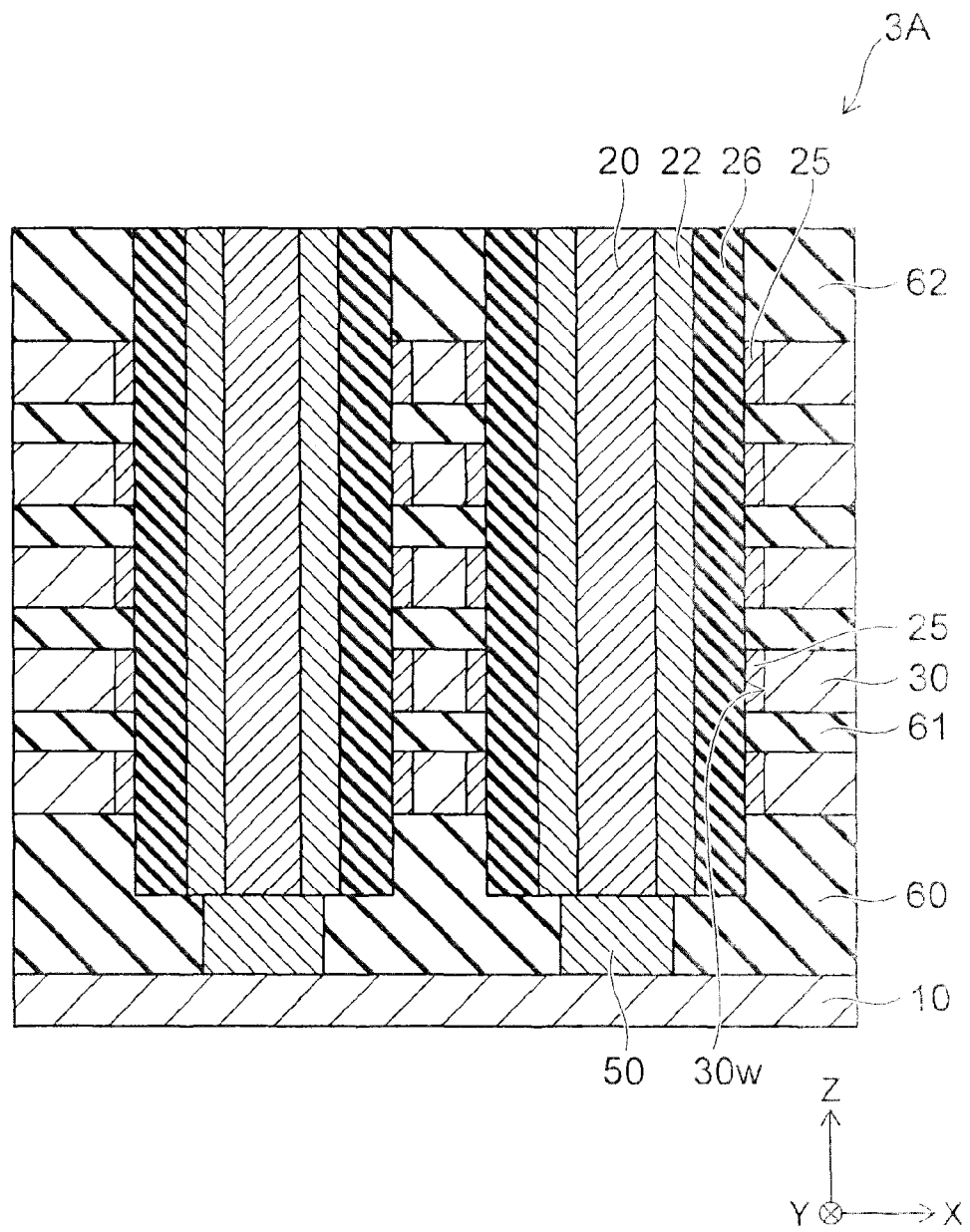
FIG. 11 is a schematic cross-sectional view showing a nonvolatile memory device according to a third embodiment.

FIG. 11 is a schematic cross-sectional view showing a nonvolatile memory device according to a third embodiment.

In a nonvolatile memory device 3A according to the third embodiment, the global bit line 10 extends in the X-direction. The local bit line 20 extends in the Z-direction, and its lower end 20d is located above the global bit line 10. The plurality of word lines 30 extend in the Y-direction, and are arranged in the Z-direction. The selector 50 is provided between the global bit line 10 and the lower end 20d of the local bit line 20.

The current limitation layer 22 is in contact with the local bit line 20, and is provided between the local bit line 20 and the plurality of word lines 30. The resistance change layer 26 is provided between the current limitation layer 22 and the plurality of word lines 30.

In the nonvolatile memory device 3A, the resistance change layer 26 is provided between the current limitation layer 22 and a metal ion source layer 25. The metal ion source layer 25 is selectively in contact with a side portion 30w of the word line 30. The composition of the metal ion source layer 25 is the same as the composition of the metal ion source layer 24. The metal ion source layer 25 is provided between the resistance change layer 26 and each of the plurality of word lines 30. The metal ion source layer 25 is not provided between a position between adjacent word lines 30 and the resistance change layer 26. In other words, the metal on source layer 25 is provided between the resistance change layer 26 and the plurality of word lines 30, and the metal ion source layer 25 is divided between adjacent word lines 30 along the local bit line 20. In other words, the metal ion source layer 25 is provided between the resistance change layer 26 and the plurality of word lines 30. The metal ion source layer 25 is divided between adjacent word lines 30 along the local bit line 20.

FIG. 12A to FIG. 13B are schematic cross-sectional views showing the manufacturing process of the nonvolatile memory device according to the third embodiment.

Figure 12A:
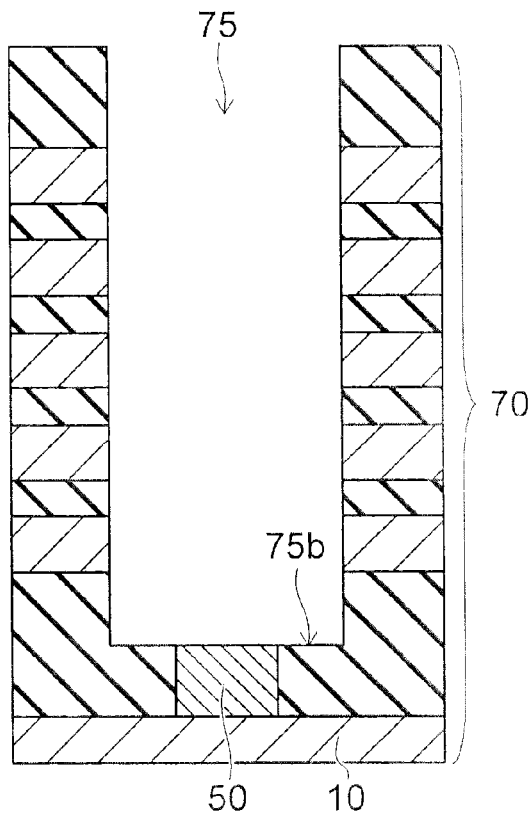
FIG. 12A to FIG. 13B are schematic cross-sectional views showing the manufacturing process of the nonvolatile memory device according to the third embodiment.

First, as shown in FIG. 12A, the trench 75 is formed in the first stacked body 70. The trench 75 is dug in the Z-direction, and extends in the Y-direction.

Figure 12B:
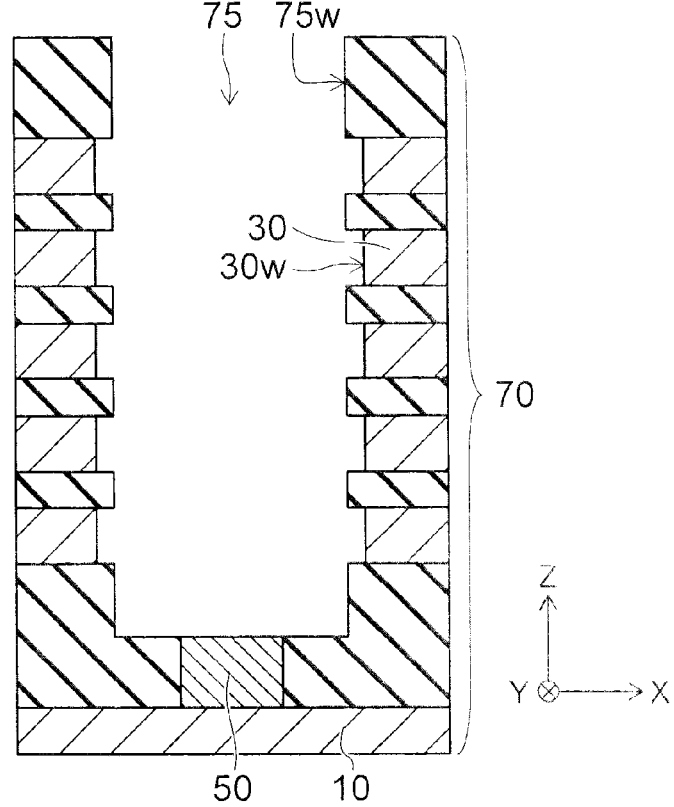

Next, as shown in FIG. 12B, side etching is performed on the side portion 30w of the word line 30 exposed at the trench 75. Thereby, a level difference is formed between the side portion 30w of the word line 30 and the inner side surface 75w of the trench 75.

Figure 13A:
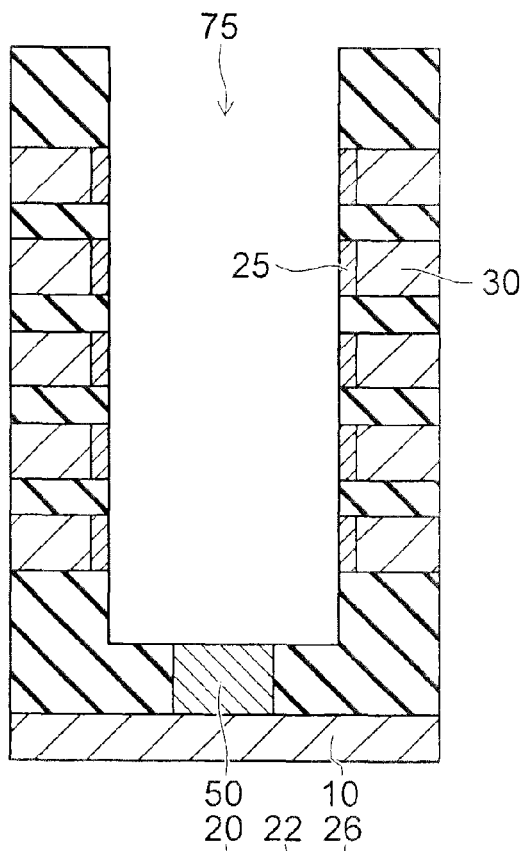

Next, as shown in FIG. 13A, the metal ion source layer 25 is selectively formed on the side portion 30w of the word line 30 by selective CVD or selective plating.

Figure 13B:
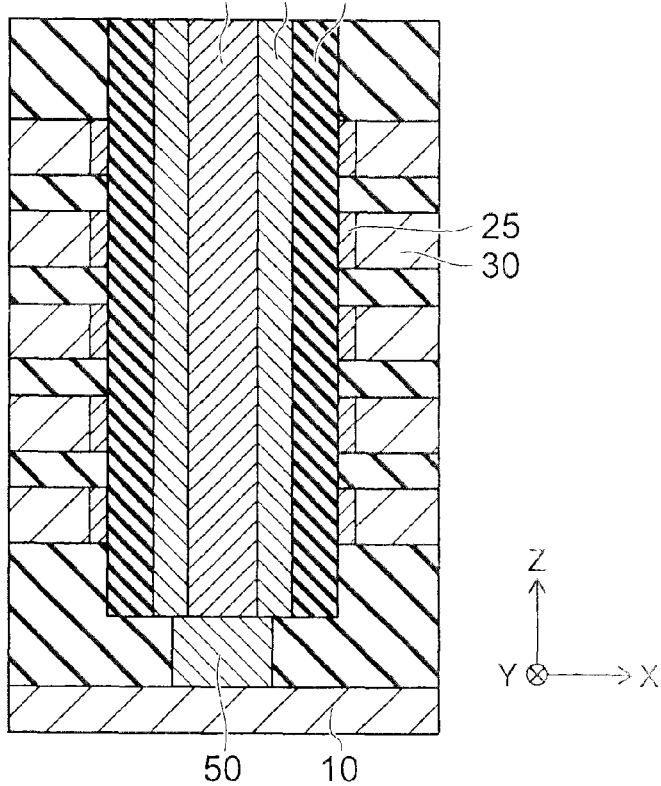

After that, as shown in FIG. 13B, the resistance charge layer 26, the current limitation layer 22, and the local bit line 20 are formed in the trench 75. By such a manufacturing process, the metal ion source layer 25 is selectively formed on the side portion 30w of each word line 30.

In the nonvolatile memory device 3A, the metal ion source layer 25 is selectively in contact with the side portion 30w of each word line 30. Therefore, the diffusion range of the metal ions released from the metal ion source layer 25 is within the memory element 40 on which data are to be stored, and metal ions are less likely to diffuse to the other memory elements 40. That is, in the nonvolatile memory device 3A, the reliability of data writing is further improved.

Fourth Embodiment

It is also possible to form a nonvolatile memory device without performing the bottom etching described above.

Figure 14A:
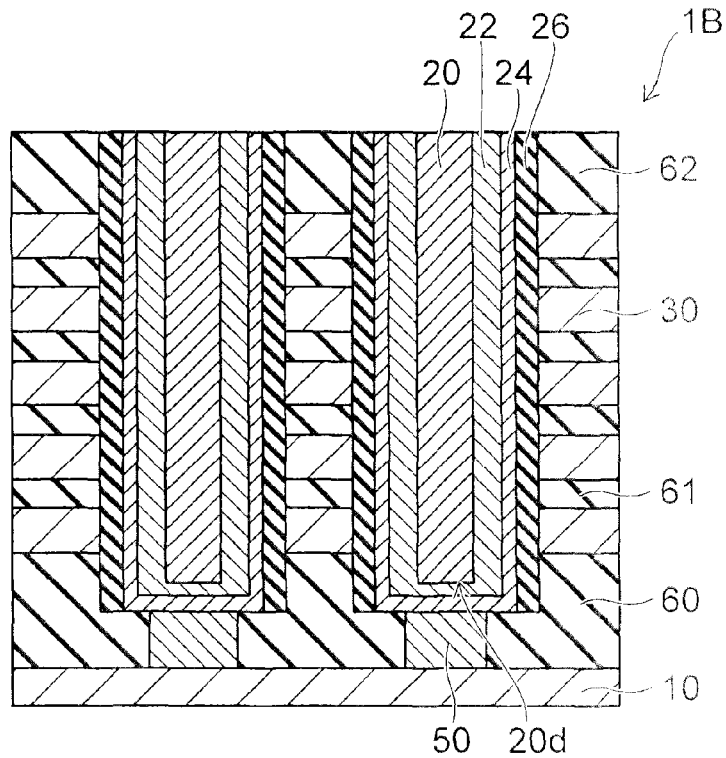
FIG. 14A and FIG. 14B are schematic cross-sectional views showing nonvolatile memory devices according to a fourth embodiment.
Figure 14B:
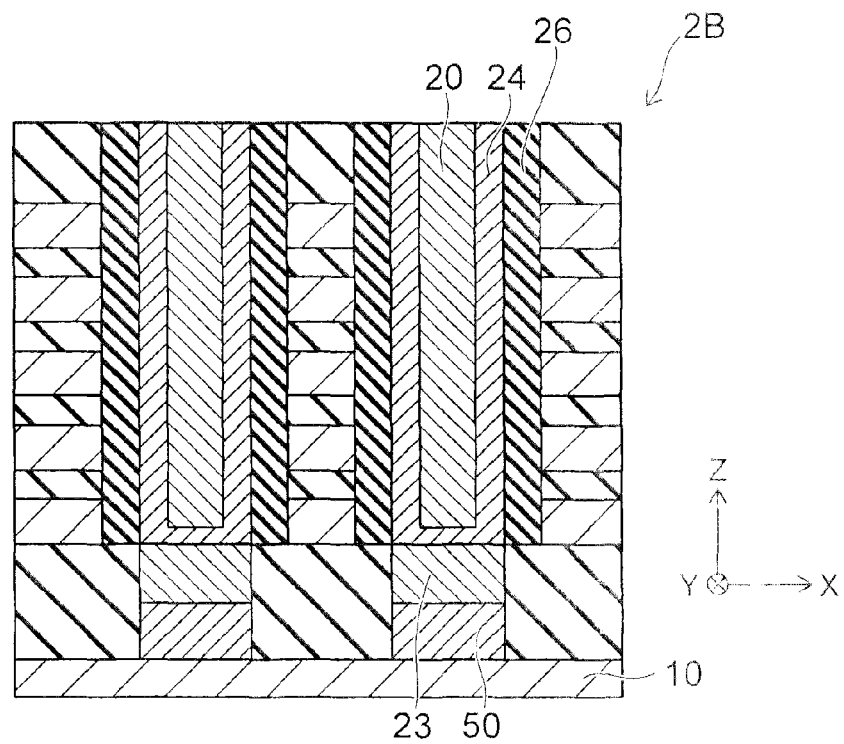

FIG. 14A and FIG. 14B are schematic cross-sectional views showing nonvolatile memory devices according to a fourth embodiment.

In this case, a nonvolatile memory device 1B has a structure in which the metal ion source layer 24 and the current limitation layer 22 are provided between the selector 50 and the lower end 20d of the local bit line 20 as shown in FIG. 14A.

In regard to the current limitation layer 22, the current limitation layer 22 provided between the local bit line 20 and the plurality of word lines 30 and the current limitation layer 22 provided between the selector 50 and the lower end of the local bit line 20 form a continuous layer along the local bit line 20.

The metal ion source layer 24 provided between the current limitation layer 22 and the plurality of word lines 30 and the metal ion source layer 24 provided between the selector 50 and the lower end 20d of the local bit line 20 form a continuous layer. In other words, the metal ion source layer 24 is provided between the current limitation layer 22 and the resistance change layer 26 and is provided also between the selector 50 and the lower end of the local bit line 20, and the metal ion source layer 24 provided between the current limitation layer 22 and the resistance change layer 26 and the metal ion source layer 24 provided between the selector 50 and the lower end of the local bit line 20 form a continuous layer along the local bit line 20. The resistance change layer 26 is provided between the metal ion source layer 24 and the plurality of word lines 30.

A nonvolatile memory device 2B has a structure in which the metal ion source layer 24 is provided between the current limitation layer 23 and the lower end 20d of the local bit line 20 as shown in FIG. 14B.

Also such structures are included in the embodiment.

In FIG. 1A, the cross section in the X-Y plane of the local bit line 20 is a rectangular shape; and in FIG. 2, a structure in which the current limitation layer 22, the metal ion source layer 24, and the resistance change layer 26 are aligned in the X-direction is illustrated. However, the embodiment is not limited to this structure.

For example, a structure is possible in which the local bit line 20 extends in the Z-direction and has a circular columnar shape, and the current limitation layer 22, the metal ion source layer 24, and the resistance change layer 26 are formed radially in this order from the central axis of the local bit line 20.

Fifth Embodiment

It is also possible to form a nonvolatile memory device without performing part of the bottom etching described above.

Figure 15A:
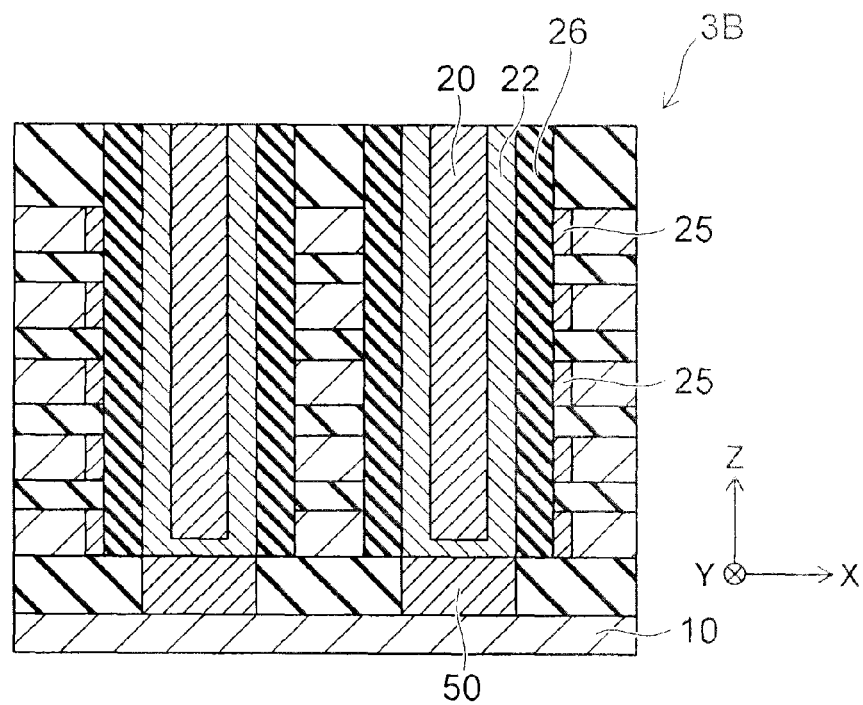
FIG. 15A and FIG. 15B are schematic cross-sectional views showing nonvolatile memory devices according to a fifth embodiment.
Figure 15B:
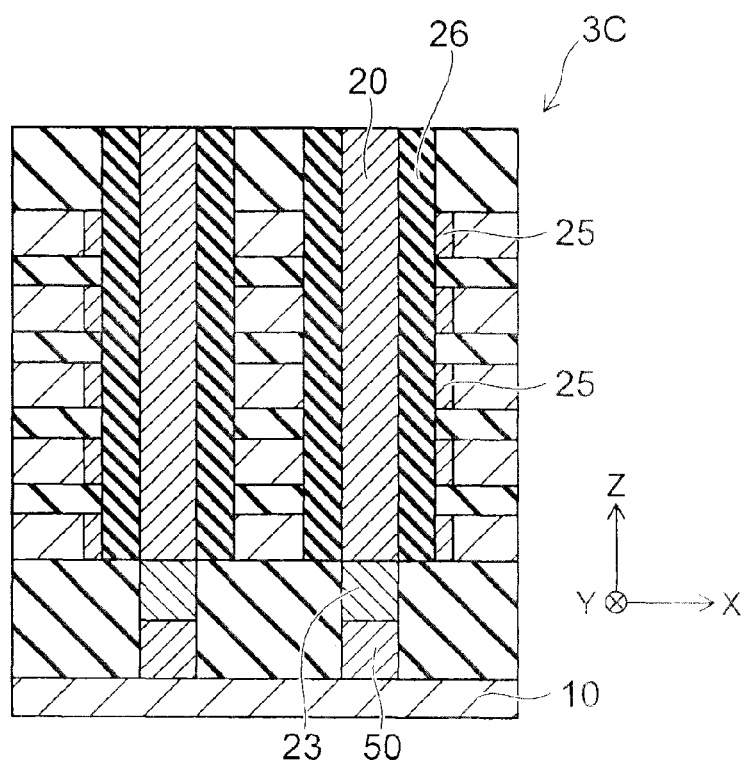

FIG. 15A and FIG. 15B are schematic cross-sectional views showing nonvolatile memory devices according to a fifth embodiment.

A nonvolatile memory device 3B shown in FIG. 15A is a modification example of the nonvolatile memory device 3A shown in FIG. 13B.

In the nonvolatile memory device 3B shown in FIG. 15A, the current limitation layer 22 is provided between the selector 50 and the lower end 20d of the local bit line 20. In regard to the current limitation layer 22, the current limitation layer 22 provided between the local bit line 20 and the plurality of word lines 30 and the current limitation layer 22 provided between the selector 50 and the lower end of the local bit line 20 form a continuous layer along the local bit line 20.

The metal ion source layer 25 is provided between the resistance change layer 26 and the plurality of word lines 30, and the metal ion source layer 25 is divided between adjacent word lines 30 along the local bit line 20.

In a nonvolatile semiconductor device 3C shown in FIG. 15B, the current limitation layer 22 is removed from the nonvolatile memory device 3B, and the resistance change layer 26 is in contact with the local bit line 20. The current limitation layer 23 is provided between the selector 50 and the lower end 20d of the local bit line 20. Also such a structure is included in the embodiment.

The embodiments have been described above with reference to examples. However, the embodiments are not limited to these examples. More specifically, these examples can be appropriately modified in design by those skilled in the art. Such modifications are also encompassed within the scope of the embodiments as long as they include the features of the embodiments. The components included in the above examples and the layout, material, condition, shape, size and the like thereof are not limited to those illustrated, but can be appropriately modified.

Furthermore, the components included in the above embodiments can be combined as long as technically feasible. Such combinations are also encompassed within the scope of the embodiments as long as they include the features of the embodiments. In addition, those skilled in the art could conceive various modifications and variations within the spirit of the embodiments. It is understood that such modifications and variations are also encompassed within the scope of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A nonvolatile memory device comprising:
a first interconnection extending in a first direction;
a second interconnection extending in a second direction crossing the first direction, and a lower end of the second interconnection being located above the first interconnection;
a plurality of third interconnections extending in a third direction, the third direction crossing the first direction and the second direction, and the third interconnections being arranged in the second direction;
a current limitation layer provided between the second interconnection and the third interconnections;
a metal ion source layer provided between the current limitation layer and the third interconnections;
a resistance change layer provided between the current limitation layer and the third interconnections; and
a selector provided between the first interconnection and the lower end of the second interconnection.

2. The device according to claim 1, wherein
the current limitation layer is provided between the selector and the lower end of the second interconnection and
the current limitation layer provided between the second interconnection and the third interconnections and the current limitation layer provided between the selector and the lower end of the second interconnection form a continuous layer along the second interconnection.

3. The device according to claim 1, wherein
the metal ion source layer is provided between the current limitation layer and the resistance change layer and the metal ion source layer is provided between the selector and the lower end of the second interconnection, and
the metal ion source layer provided between the current limitation layer and the resistance change layer and the metal ion source layer provided between the selector and the lower end of the second interconnection form a continuous layer along the second interconnection.

4. The device according to claim 1, wherein a resistivity of the current limitation layer is 1 $\Omega \cdot cm$ to $10^8$ $\Omega \cdot cm$.

5. The device according to claim 1, wherein the metal on source layer is provided between the current limitation layer and the resistance change layer.

6. The device according to claim 1, wherein
the metal ion source layer is provided between the resistance change layer and the third interconnections and
the metal ion source layer is divided between adjacent ones of the third interconnections along the second interconnection.

7. The device according to claim 6, wherein
the current limitation layer is provided between the selector and the lower end of the second interconnection and
the current limitation layer provided between the second interconnection and the third interconnections and the current limitation layer provided between the selector and the lower end of the second interconnection form a continuous layer along the second interconnection.

8. The device according to claim 1, wherein the resistance change layer includes a silicon oxide film.

9. The device according to claim 1, wherein a metal ion released from the metal ion source layer being capable of diffusing into the resistance change layer.

10. A nonvolatile memory device comprising:
a first interconnection extending in a first direction;
a second interconnection extending in a second direction crossing the first direction, and a lower end of the second interconnection being located above the first interconnection;
a plurality of third interconnections extending in a third direction, the third direction crossing the first direction and the second direction, and the third interconnections being arranged in the second direction;
a selector provided between the first interconnection and the lower end of the second interconnection;
a current limitation layer provided between the selector and the lower end of the second interconnection;
a metal ion source layer provided between the second interconnection and the third interconnections; and
a resistance change layer provided between the second interconnection and the third interconnections.

11. The device according to claim 10, wherein the resistance change layer is provided between the metal ion source layer and the third interconnections.

12. The device according to claim 10, wherein
the metal ion source layer is provided between the resistance change layer and the third interconnections and
the metal ion source layer is divided between adjacent ones of the third interconnections along the second interconnection.

13. The device according to claim 10, wherein
the metal ion source layer is provided between the current limitation layer and the lower end of the second interconnection and
the metal ion source layer provided between the second interconnection and the third interconnections and the metal ion source layer provided between the selector and the lower end of the second interconnection form a continuous layer along the second interconnection.

14. The device according to claim 10, wherein a resistivity of the current limitation layer is 1 $\Omega \cdot cm$ to $10^8$ $\Omega \cdot cm$.

15. The device according to claim 10, wherein the resistance change layer includes a silicon oxide film.

16. The device according to claim 10, wherein a metal ion released from the metal ion source layer being capable of diffusing into the resistance change layer.

17. A method for manufacturing a nonvolatile memory device comprising:

forming a first stacked body on a plurality of first interconnections via a selector, the first interconnections extending in a first direction and arranged in a third direction crossing the first direction, a conductive layer and an interlayer insulating film being alternately stacked in a second direction crossing the first direction and the third direction in the first stacked body; forming a trench dug in the second direction and extending in the third direction in the first stacked body to expose the selector at a bottom of the trench, and forming a plurality of third interconnections extending in the third direction and arranged in the second direction by the first stacked body being separated in the first direction by the trench; forming a second stacked body in the trench, in the second stacked body, a second interconnection in contact with the selector, and the second interconnection extending in the second direction, a current limitation layer provided between the second interconnection and the third interconnections, and the current limitation layer being in contact with the second interconnection, a metal ion source layer provided between the current limitation layer and the third interconnections, and a resistance change layer provided between the metal ion source layer and the third interconnections or between the current limitation layer and the metal ion source layer being stacked in the first direction; and separating the second stacked body in a third direction.

* * * * *